United States Patent
Krall et al.

(10) Patent No.: US 11,762,010 B2
(45) Date of Patent: Sep. 19, 2023

(54) SYSTEMS AND METHODS FOR ENERGY DIAGNOSTICS TO IDENTIFY EQUIPMENT MALFUNCTIONS

(71) Applicant: Sacramento Municipal Utility District, Sacramento, CA (US)

(72) Inventors: Lucas Krall, Sacramento, CA (US); Jeffrey Paull, Citrus Heights, CA (US); Yareli Herrera, Sacramento, CA (US)

(73) Assignee: Sacramento Municipal Utility District, Sacramento, CA (US)

( * ) Notice: Subject to any disclaimer, the term of this patent is extended or adjusted under 35 U.S.C. 154(b) by 39 days.

(21) Appl. No.: 17/503,256

(22) Filed: Oct. 15, 2021

(65) Prior Publication Data

US 2023/0122964 A1    Apr. 20, 2023

(51) Int. Cl.
  *G01R 31/52*  (2020.01)
  *G01R 31/28*  (2006.01)
  *G01R 31/40*  (2020.01)

(52) U.S. Cl.
  CPC ......... *G01R 31/2874* (2013.01); *G01R 31/40* (2013.01); *G01R 31/52* (2020.01)

(58) Field of Classification Search
  CPC ..... G01R 31/2874; G01R 31/40; G01R 31/52
  See application file for complete search history.

(56) References Cited

U.S. PATENT DOCUMENTS

| | | | |
|---|---|---|---|
| 9,111,322 B2 | 8/2015 | Amram et al. | |
| 9,612,286 B2 | 4/2017 | Gupta et al. | |
| 9,625,889 B2 | 4/2017 | Gupta et al. | |
| 10,114,347 B2 | 10/2018 | Gupta et al. | |
| 10,460,274 B2 | 10/2019 | He et al. | |
| 10,630,502 B2 | 4/2020 | Shyr et al. | |
| 11,092,953 B2 * | 8/2021 | Cohen | F24F 11/56 |
| 2012/0215369 A1 * | 8/2012 | Desai | G06Q 50/06 |
| | | | 700/291 |
| 2012/0323510 A1 * | 12/2012 | Bell | H02J 3/14 |
| | | | 702/62 |

(Continued)

OTHER PUBLICATIONS

Eskander et al., "A complementary unsupervised load disaggregation method for residential loads at very low sampling rate data," Sustainable Energy Technologies and Assessments, Dec. 3, 2020, pp. 1-16.

(Continued)

*Primary Examiner* — Jermele M Hollington
*Assistant Examiner* — Demetrius R Pretlow
(74) *Attorney, Agent, or Firm* — InventIQ Legal LLP; Steven J. Cahill

(57) ABSTRACT

A computer system that includes a processor device and a storage device is configured to determine a base load at a utility customer site using power usage data for the utility customer site, to determine a variable load at the utility customer site during a range of temperature independent days using the power usage data, and to determine a temperature dependent load at the utility customer site that exceeds the variable load and the base load using the power usage data. The computer system is further configured to assign a flag to each time interval that the temperature dependent load exceeds a power usage threshold and to determine if the utility customer site has an equipment malfunction based on a number of the flags assigned within a time period.

20 Claims, 7 Drawing Sheets

(56) References Cited

U.S. PATENT DOCUMENTS

| | | | |
|---|---|---|---|
| 2013/0085616 A1* | 4/2013 | Wenzel | F24F 11/47 |
| | | | 700/278 |
| 2013/0289788 A1 | 10/2013 | Gupta et al. | |
| 2016/0070285 A1 | 3/2016 | Gupta et al. | |
| 2016/0070286 A1 | 3/2016 | Gupta et al. | |
| 2017/0300046 A1* | 10/2017 | Kerbel | F24F 11/38 |
| 2017/0330103 A1 | 11/2017 | Shyr et al. | |
| 2018/0210900 A1 | 7/2018 | Gupta et al. | |
| 2018/0231603 A1 | 8/2018 | Gupta et al. | |
| 2018/0238711 A1 | 8/2018 | Zimmer | |
| 2018/0348711 A1* | 12/2018 | Gupta | G05B 13/02 |
| 2019/0102492 A1* | 4/2019 | Majewski | G06F 30/20 |
| 2019/0121337 A1* | 4/2019 | Cohen | F24F 11/46 |
| 2019/0293317 A1* | 9/2019 | Lazar | F24F 11/52 |
| 2019/0312749 A1* | 10/2019 | Kim | G01R 11/52 |
| 2020/0034768 A1* | 1/2020 | Yamaguchi | H02J 3/004 |
| 2021/0372647 A1* | 12/2021 | Cohen | F24F 11/46 |
| 2022/0050409 A1* | 2/2022 | Koehler | B41J 29/393 |

OTHER PUBLICATIONS

Chin et al., "Household electricity load disaggregation based on low-resolution smart meter data," International Journal of Smart Grid and Clean Energy, 2016, pp. 188-195.

Birt et al., "Disaggregating categories of electrical energy end-use from whole-house hourly data," NRC Publications Archive, pp. 1-28, Jul. 2012.

Albert et al., "Thermal profiling of residential energy consumption," 2016, pp. 1-8.

* cited by examiner

SYSTEMS AND METHODS FOR ENERGY DIAGNOSTICS TO IDENTIFY EQUIPMENT MALFUNCTIONS

FIELD OF THE DISCLOSURE

The present disclosure relates to systems and methods for energy diagnostics, and more particularly, to systems and methods for energy diagnostics to identify equipment malfunctions.

BACKGROUND

Household appliances often use substantially more energy (e.g., electricity) than the appliances were designed to use when the appliances are malfunctioning. Appliance malfunctions are one of many possible reasons for abnormally high energy usage in residential households. Because there may be many reasons for abnormally high energy usage in an individual residence household, it is often difficult to determine if abnormally high energy usage is the result of malfunctioning appliances or has other causes, which may prevent the detection of appliance system failure.

DETAILED DESCRIPTION

Figure 1:
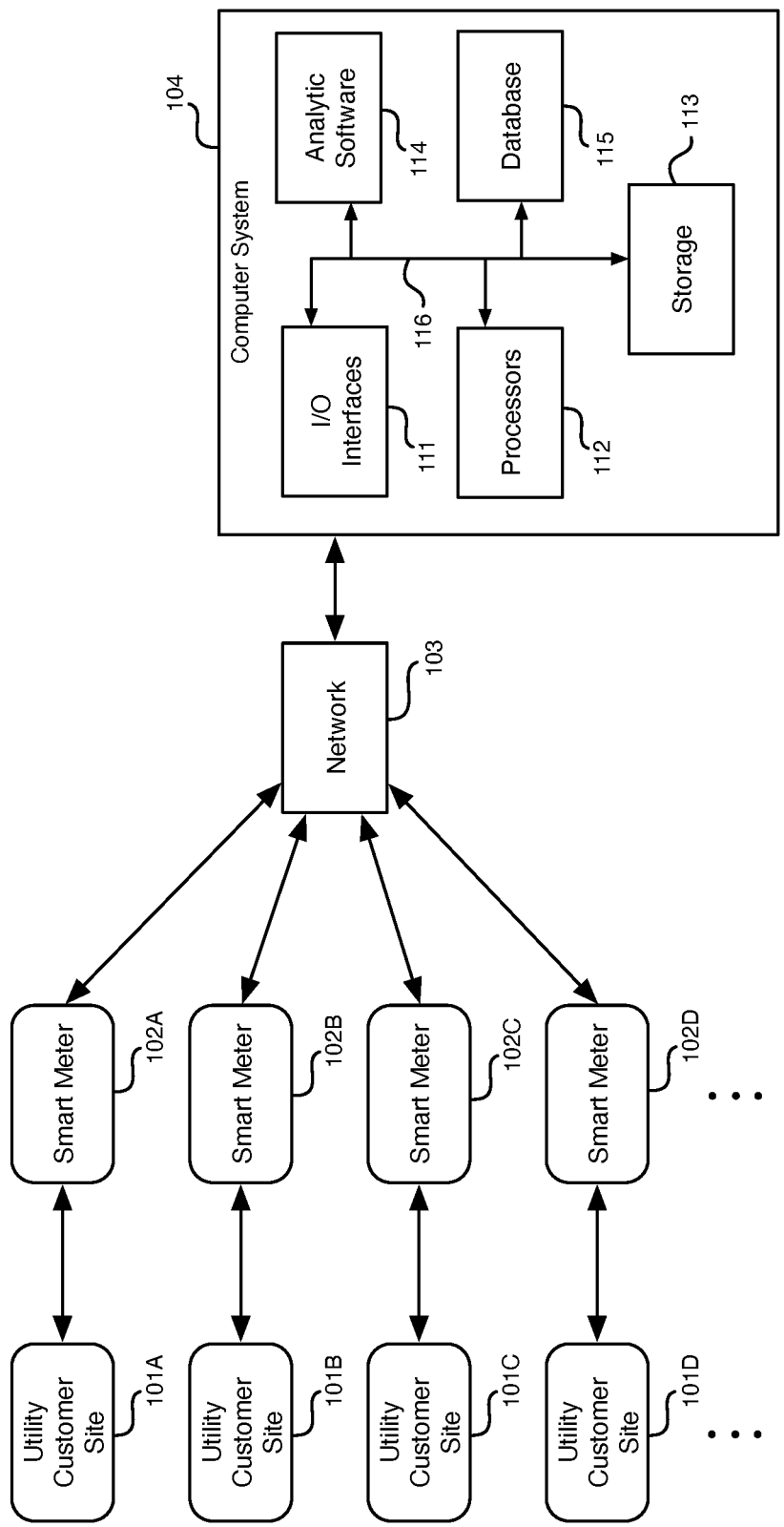
FIG. 1 is a diagram illustrating a system that uses smart meters to measure voltages, electric current, and electric power usage at utility customer sites, according to an embodiment.

Many residential households face abnormally high electricity bills that are caused by serious malfunctions of equipment, such as household appliances. Typically, abnormally high residential electricity usage is caused by heating, ventilation, and air-conditioning (HVAC) equipment, because HVAC equipment is usually the largest user of residential energy. Many households are unable to identify the cause of the high electricity usage on their own, and members of households facing abnormally high electricity bills rarely contact the electricity provider (i.e., the utility) to determine the cause of their high electricity bills.

According to some embodiments disclosed herein, a customized analytical algorithmic process is provided to disaggregate base, variable, and temperature dependent energy loads to identify households with major equipment malfunctions. This process may utilize an array of data mining techniques, such as regression analysis, data stratification, and machine learning clustering algorithms applied to electric meter data from many households to generate sets of flags that identify households with a repeating pattern of abnormally high energy usage. A repeating pattern of abnormally high energy usage in certain households that exceeds predefined thresholds may indicate equipment malfunctions in these households. After households that have a repeating pattern of high energy usage are identified, one or more analysts can manually review each individual household and conduct root cause analysis to determine the exact cause of the malfunction. Individual customer diagnostics may be conducted to specifically diagnose equipment malfunctions. Additionally, this part of the process may prioritize the customers with the largest issues and filter out those customers with non-issues.

An electric meter is a device that monitors the amount of electric power drawn from an electric distribution system at a utility customer site. One type of electric meter that is used to monitor a customer's electric power consumption from an electric distribution system is an electric smart meter (also referred to herein as a smart meter). Smart meters monitor electric power usage, electric current, and/or voltage at utility customer sites that are connected to the electric distribution system. Smart meters can also monitor the amount of electric power and/or electric current provided from utility customer sites to the electric distribution system. Smart meters automatically transmit electric power usage and voltage data from utility customer sites to the electric utility that provides electric power to the utility customer sites. Smart meters may be part of an advanced metering infrastructure (AMI) or an automatic meter reading (AMR) system.

An electric utility may collect energy usage data for a set of electric meters (e.g., smart meters) in an electric grid (i.e., an electric distribution system). The data may include, for example, information collected on at least an hourly basis for each electric meter. The data may include an hourly average voltage for each electric meter and hourly power consumption data for each electric meter.

FIG. 1 is a diagram illustrating a system that uses smart meters to measure voltages, electric current, and electricity usage at utility customer sites, according to an embodiment. In the embodiment of Figure (FIG. 1, utility customer sites 101A, 101B, 101C, and 101D (collectively referred to herein as utility customer sites 101) associated with smart meters 102A, 102B, 102C, and 102D (collectively referred to herein as smart meters 102), respectively, are connected through a network 103 to a computer system 104. Each of the smart meters 102 is connected to receive electric power from an electric grid and is connected to provide the electric power to devices at an associated one of the customer sites 101. The electric grid (i.e., the electric distribution system) is not shown in FIG. 1. Four utility customer sites 101 and four associated smart meters 102 are shown in FIG. 1 as examples. Although it should be understood that an electric grid is typically connected to provide electric power to hundreds, thousands, or even millions of customer sites.

Each of the utility customer sites 101 has an electric meter, such as a smart meter 102, that monitors electricity usage and voltage.

Each of the smart meters 102 periodically sends measurements of voltages (i.e., voltage data), electric current, and/or electricity consumption through network 103 to computer system 104 for processing. Each of the smart meters 102 measures the voltage at its connection to the electric grid at the associated customer site 101. Each of the smart meters 102 also measures the amount of electricity (i.e., power) drawn from (or provided to) the electric grid. As an example, each of the smart meters 102 may send the voltage data and the electricity usage data in kilowatt hours (kWh) to computer system 104 each hour of each day. Communications of data from the smart meters 102 to the computer system 104 may be through wireless connections, wires, power lines, or any combination thereof in network 103.

Computer system 104 includes one or more input/output (I/O) interfaces 111, one or more processor devices 112, one or more storage devices 113, analytic software 114, and one or more databases 115. The components 111-115 of the computer system 104 can communicate through connections 116. Computer system 104 may, for example, be located at a facility that is operated by the electric utility. Processors 112 may include any processing circuit or device, such as, for example, a CPU (central processing unit), microprocessor, graphics processing unit (GPU), field programmable gate array, and/or other forms of processor circuitry. Storage devices 113 may include memory devices such as solid state devices, disc storage devices, magnetic tape, etc. The storage devices 113 may be organized into any suitable configuration, for example, a storage area network. The input/output interfaces 111 may include, for example, devices for inputting data to the processors 112 (e.g., a mouse and a keyboard), and a mechanism for providing results from the processors 112 (e.g., printers and computer monitors).

The voltage, current, and/or power usage data provided from smart meters 102 through network 103 may be stored in storage devices 113 in computer system 104. The analytic software 114 can access the voltage, current, and/or power usage data stored in storage devices 113 using database 115. The analytic software 114 can analyze the voltage, current, and/or power usage data and generate the results disclosed herein. Analytic software 114 can be stored in non-transitory (e.g., tangible) computer readable storage media. The non-transitory computer readable storage media may include volatile or non-volatile memory circuits, magnetic disc drives, solid state storage drives, removable flash memory devices or other removable memory devices, optical disc drives, floppy disks, magnetic tapes, or any other suitable memory or storage device(s). When the analytic software 114 is installed in computer system 104, the storage devices 113 have instructions and data that cause the devices in computer system 104 to execute various processes. Analytic software 114 can be run on one or more processors 112. One or more users may interface with the analytic software 114 using one or more I/O interfaces 111.

Figure 2:
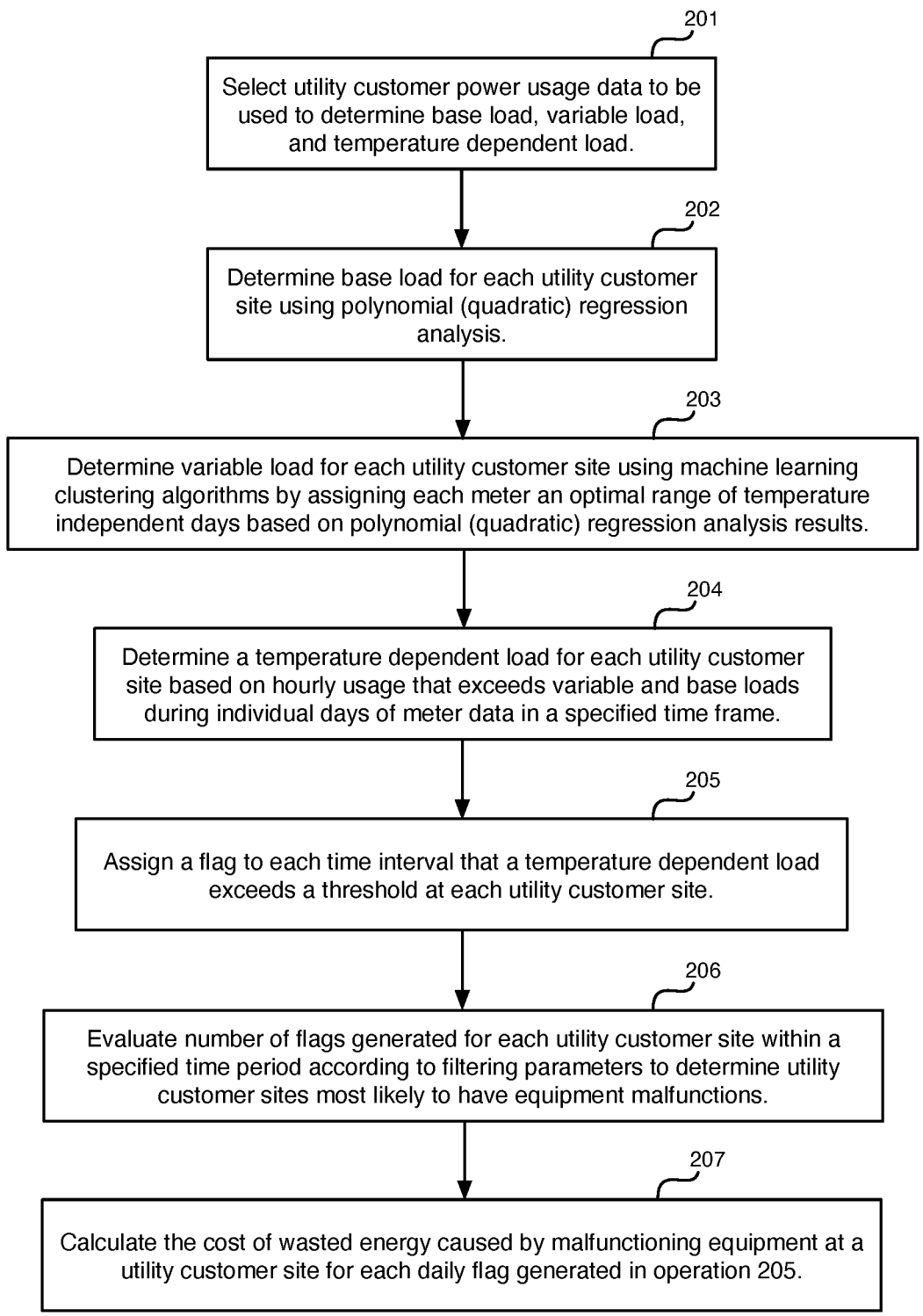
FIG. 2 is a flow chart that illustrates examples of operations that may be performed to analyze utility customer power usage data to identify equipment malfunctions, according to an embodiment.

FIG. 2 is a flow chart that illustrates examples of operations that may be performed to analyze utility customer power usage data to identify equipment malfunctions, according to an embodiment. The operations of FIG. 2 may, for example, be performed by a customized analytical algorithmic process that disaggregates base, variable, and temperature dependent energy loads to identify households with major equipment malfunctions. The process of FIG. 2 may, for example, be performed by the analytic software 114 of computer system 104. The utility customer power usage data used in the operations of FIG. 2 may be, for example, transmitted from smart meters 102 located at many utility customer sites 101 (e.g., hundreds, thousands, or millions of sites) through network 103 to computer system 104 and stored in storage 113.

In operation 201, utility customer power usage data is selected to be used to determine a base load, a variable load, and a temperature dependent load for a utility customer site. Base load represents the minimum amount of energy that is always consumed at a utility customer site, such as a continuous load from appliances (e.g. refrigerators), vampire load from electronics on standby, etc. Base loads from multiple utility customer sites can be compared to each other to identify inefficiencies in devices that continuously draw power. Variable load reflects various power consuming equipment that households turn on manually, such as electric lights, computers, televisions, microwave ovens, dryers, washing machines, dishwashers, etc. Analysis of the variable loads at one or more utility customer sites may uncover inefficient lighting and other electronic issues. Temperature dependent load is comprised of heating and cooling loads that are turned on and off in response to the weather, including the outdoor temperature (e.g. HVAC equipment, heat pumps, etc.).

The utility customer power usage data selected in operation 201 may be filtered (e.g., by database 115) to select specific time frames. As a specific example, utility customer power usage data may be selected in operation 201 for weekdays only. As another example, utility customer power usage data may be selected in operation 201 for a previous year to determine the base load and the variable load for a utility customer site. As yet another example, recent utility customer power usage data (e.g., the most recent weeks or months of data) may also be selected in operation 201 to determine a temperature dependent load for a utility customer site (depending on the scope of the analysis). As another example, analytic software 114 may exclude data from utility customer sites known to have solar photovoltaic (PV) systems and/or electric vehicles in operation 201.

In operation 202, a base load is determined for each utility customer site using polynomial (quadratic) regression analysis. As discussed above, the base load is the minimum amount of electricity that is continuously consumed at a utility customer site. Base load may, for example, include continuous load from devices such as household appliances, consumer electronic devices, etc. that are continuously on. In operation 202, the process of FIG. 2 adapts to each electric meter and selects optimal days of power usage that are independent of the outdoor temperature (i.e., temperature independent days) to determine the base load. Three metrics may be created in operation 202 including the hourly base load (e.g., in kilowatt hours), the average hourly kilowatt hours (kWh), and the balance temperature. The hourly base load is used for load disaggregation and may be based on the interval of lowest power usage. The average hourly kWh is used for temperature independent days, for example, to identify grow houses (i.e., utility customer sites that use an abnormally large amount of electricity for lighting to grow indoor plants). The balance temperature is used for identifying optimal temperature independent days.

Figure 3:
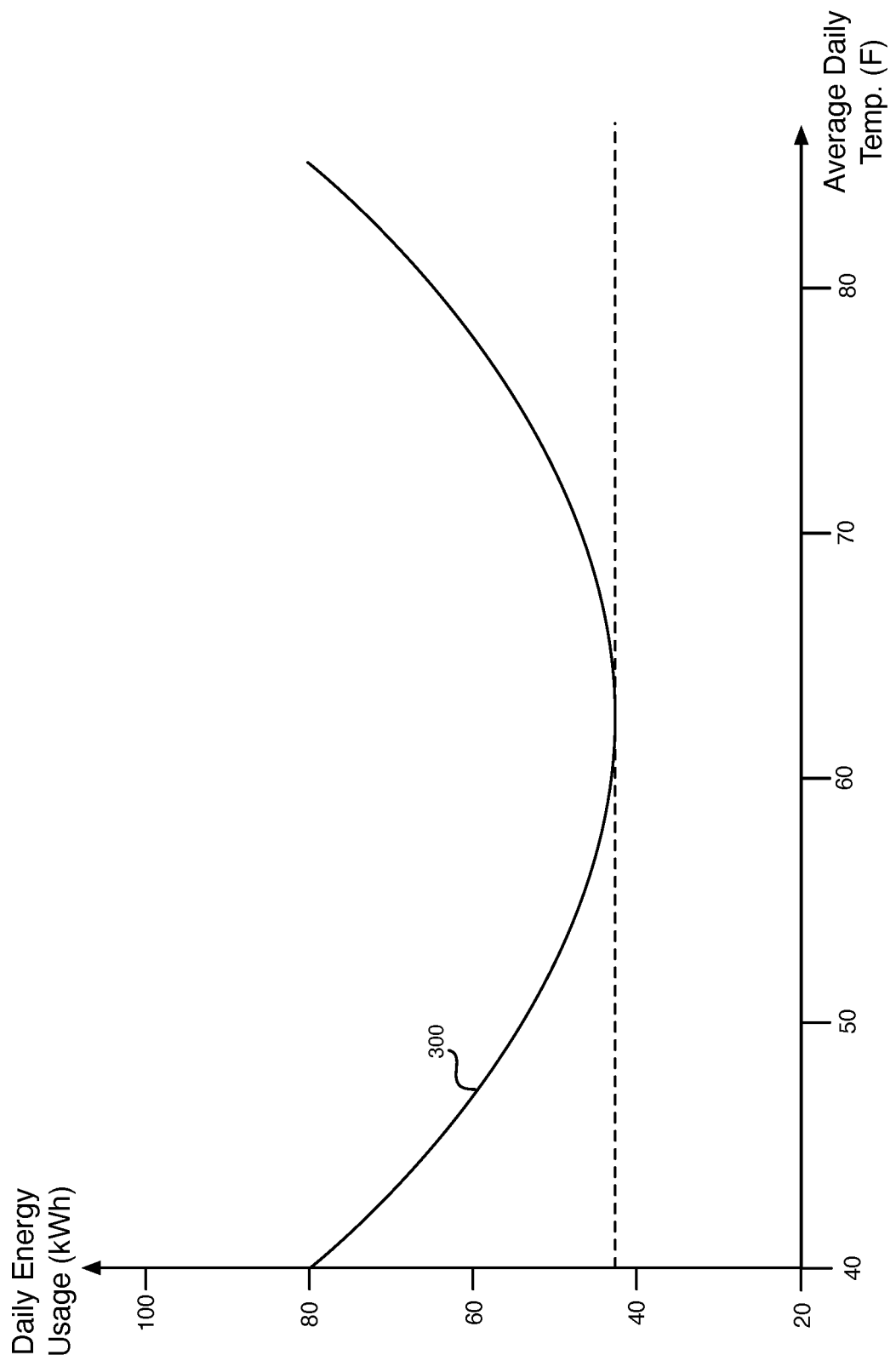
FIG. 3 is a graph that illustrates an example of the average daily electricity usage in kilowatt hours (kWh) at one or more utility customer sites over a range of average daily outdoor temperatures that may be used to select temperature independent days, according to an embodiment.

FIG. 3 is a graph that illustrates an example of the average daily electricity usage in kilowatt hours (kWh) at one or more utility customer sites over a range of average daily outdoor temperatures that may be used to select temperature independent days, according to an embodiment. In the example of FIG. 3, the average daily electricity usage in kWh at one or more utility customer sites over a range of average daily outdoor temperatures is plotted in curve 300. As shown in FIG. 3, the average daily electricity usage indicated by curve 300 reaches a global minimum of 42.5 kWh at an average daily outdoor temperature of about 62.5 degrees Fahrenheit (F), which represents the temperature independent daily usage (i.e., the balance temperature). As an example, polynomial (quadratic) ordinary least squares (OLS) regressions may be conducted on power usage data from each individual electric meter to generate the predicted usage curve 300. However, the regression analysis used in various embodiments disclosed herein to determine the base load in operation 202 does not have to be performed at the daily level. The regression analysis can be completed at the hourly level or in time intervals that are even more granular than hours (e.g., minutes).

The process of FIG. 2 adapts to each electric meter and selects the optimal range of power usage that is independent of temperature. Days having average outdoor temperatures that fall within this optimal range are selected as temperature independent days for determining the base and variable loads in operations 202-203. The process of FIG. 2 automatically learns the specific balance temperature for each electric meter at which power usage is at a minimum. The process of FIG. 2 generates a range of specific days having average outdoor temperatures that are +/− a designated percentage of the balance temperature to be used for estimating base load and variable load. For example, the process of FIG. 2 may select days having average outdoor temperatures that are +/−5 degrees of the balance temperature as being temperature independent days. The curve 300 of FIG. 3 may be generated by summing daily kWh power usage or hourly kWh power usage at one or more utility customer sites. The process of FIG. 2 may be programmed to automatically conduct tests for statistical significance and to drop utility customer sites with insignificant regression results.

In operation 203, a variable load is determined for each utility customer site using machine learning clustering algorithms by assigning each electric meter an optimal range of temperature independent days based on polynomial (quadratic) regression analysis results from operation 202. Based on the polynomial regression analysis results of operation 202, each electric meter is assigned to an optimal range of temperature independent days. Machine learning clustering algorithms analyze data from each individual electric meter during the days of power usage within the range of temperature independent days to learn their specific load shapes and power usage patterns. The process of FIG. 2 then selects a representative variable load profile for each electric meter based on the frequency of the clusters generated by the machine learning clustering algorithms.

The variable load generated for a utility customer site from operation 203 and the base load generated for the same utility customer site from operation 202 are then combined into one load profile for that utility customer site. The results are considered a generalized representation of daily power usage at the utility customer site that can be applied statically to the electric meter at that site for each weekday to be analyzed. Disaggregating the base and variable loads in operations 202 and 203 are important to understanding utility customer behaviors regarding power usage during periods of power usage that are temperature independent (i.e., independent of variations in the outdoor temperature).

After the representative base and variable loads are disaggregated from the overall load profile for each electric meter at each utility customer site in operations 202-203, individual days of electric meter power usage data with a high likelihood of having temperature dependent loads (e.g. in the summer months) are brought into the process of FIG. 2. In operation 204, a temperature dependent load is determined for each utility customer site based on hourly power usage that exceeds the variable and base loads at the utility customer site during individual days of electric meter data in a specified time frame. Hourly power usage that exceeds variable and base loads is assigned to temperature dependent loads. Temperature dependent load estimations may change for each day that the process of FIG. 2 analyzes power usage data.

Figure 4:
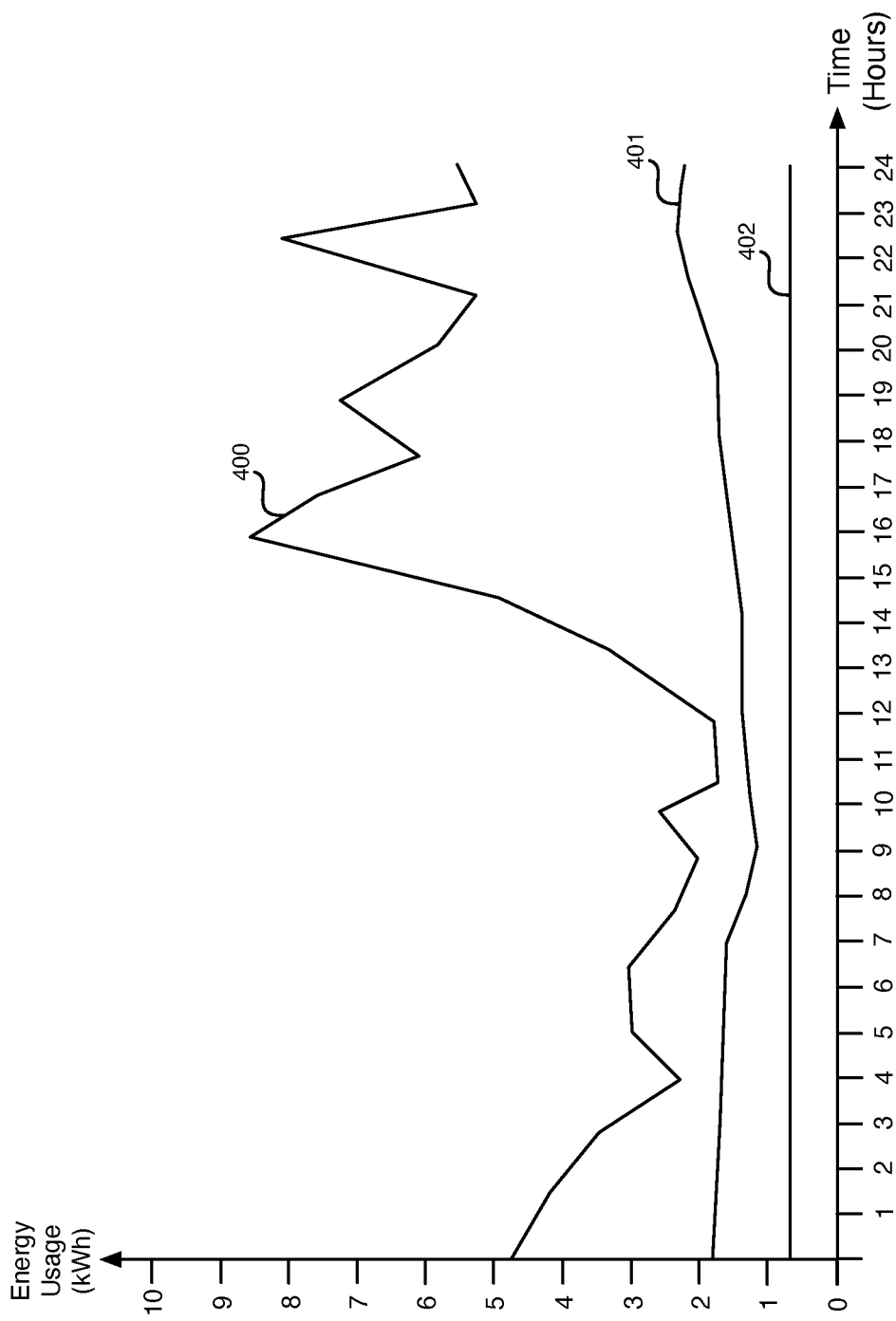
FIG. 4 is a graph that illustrates examples of the base load, the temperature independent variable load, and the temperature dependent load at an exemplary utility customer site during one day, according to an embodiment.

FIG. 4 is a graph that illustrates examples of the base load, the temperature independent variable load, and the temperature dependent load at an exemplary utility customer site during one day, according to an embodiment. In FIG. 4, curve 400 is an example of a temperature dependent load at a utility customer site, curve 401 is an example of a temperature independent variable load at the utility customer site, and curve 402 is an example of a base load at the utility customer site over 24 hours.

In operation 205, a flag is assigned to each time interval that a temperature dependent load exceeds a threshold at each utility customer site. The threshold is greater than the combined base and variable load profiles at a utility customer site. The threshold is applied to the temperature dependent load from a utility customer site for each day within the scope of the analysis determined in operation 201 to determine if any flags should be assigned in operation 205. In some embodiments, two or more thresholds may be applied to the temperature dependent load to determine if any flags should be assigned in operation 205. As a specific example, an hourly flag may be assigned to each hourly time interval that the temperature dependent load at a utility customer site exceeds the threshold(s). In this example, a daily flag may be assigned to each day of power usage at a utility customer site that is assigned more hourly flags in that day than a predefined maximum number of hourly flags. The predefined maximum number of hourly flags that is used to determine the assignment of a daily flag may be an adjustable parameter that is dependent on the scope of the analysis.

Figure 5:
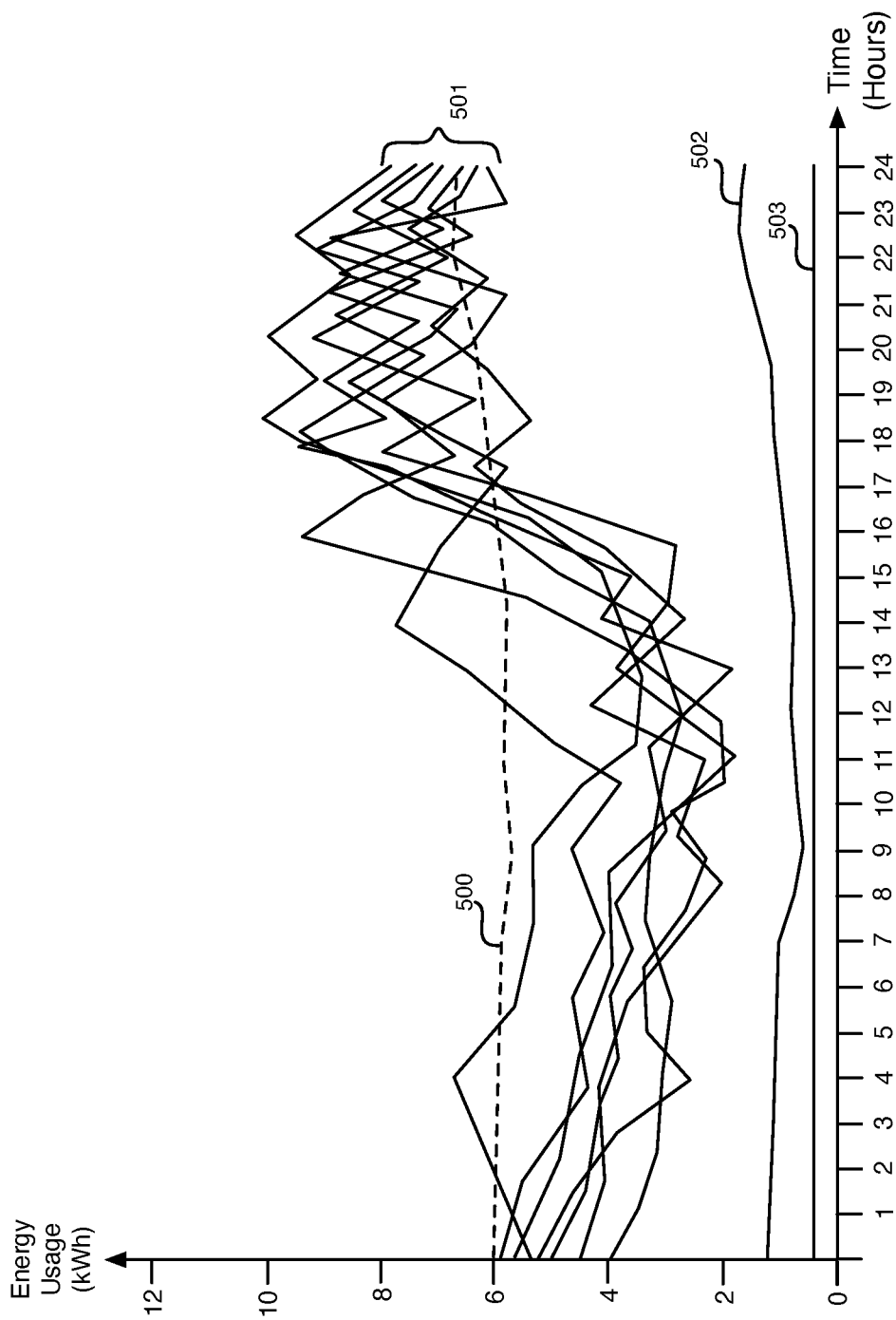
FIG. 5 is a graph that illustrates an example of a single threshold that is used to determine whether to assign a flag at each hourly interval that is analyzed in each day of power usage data evaluated from a utility customer site, according to an embodiment.

In an embodiment, a single threshold is used to determine if a flag is to be assigned at each time interval analyzed in each day of power usage data that is evaluated in operation 205. FIG. 5 is a graph that illustrates an example of a single threshold 500 that is used to determine whether to assign a flag at each hourly time interval that is analyzed in each day of power usage data evaluated from a utility customer site, according to an embodiment. In the graph of FIG. 5, the temperature dependent load for each of 7 different days is shown by the 7 lines 501. In this example, the process of FIG. 2 compares the threshold 500 to each of the 7 temperature dependent load lines 501 for each of the 7 days at each of the 24 hourly time intervals in operation 205 to determine whether to assign an hourly flag to each hourly time interval. The threshold 500 is 5 kWh greater than the variable load 502 in the example of FIG. 5. FIG. 5 also shows the base load 503. In operation 205, an hourly flag is assigned to each hourly time interval during which the temperature dependent load 501 for any of the days evaluated exceeds the threshold 500. Operation 205 is repeated for each of the temperature dependent load lines 501 for each of the days evaluated. A daily flag may be assigned to each day having a number of hourly flags that exceeds a predefined maximum number (e.g., 16) of hourly flags. Comparing each hourly interval in each day to the threshold 500 allows for identifying major equipment malfunctions occurring throughout entire days. In alternative embodiments, only a subset of the 24 hours of power usage data for each day (e.g., 10-23 hours of power usage data) is compared to the threshold to determine whether to assign an hourly flag to each hourly interval in the subset.

Figure 6:
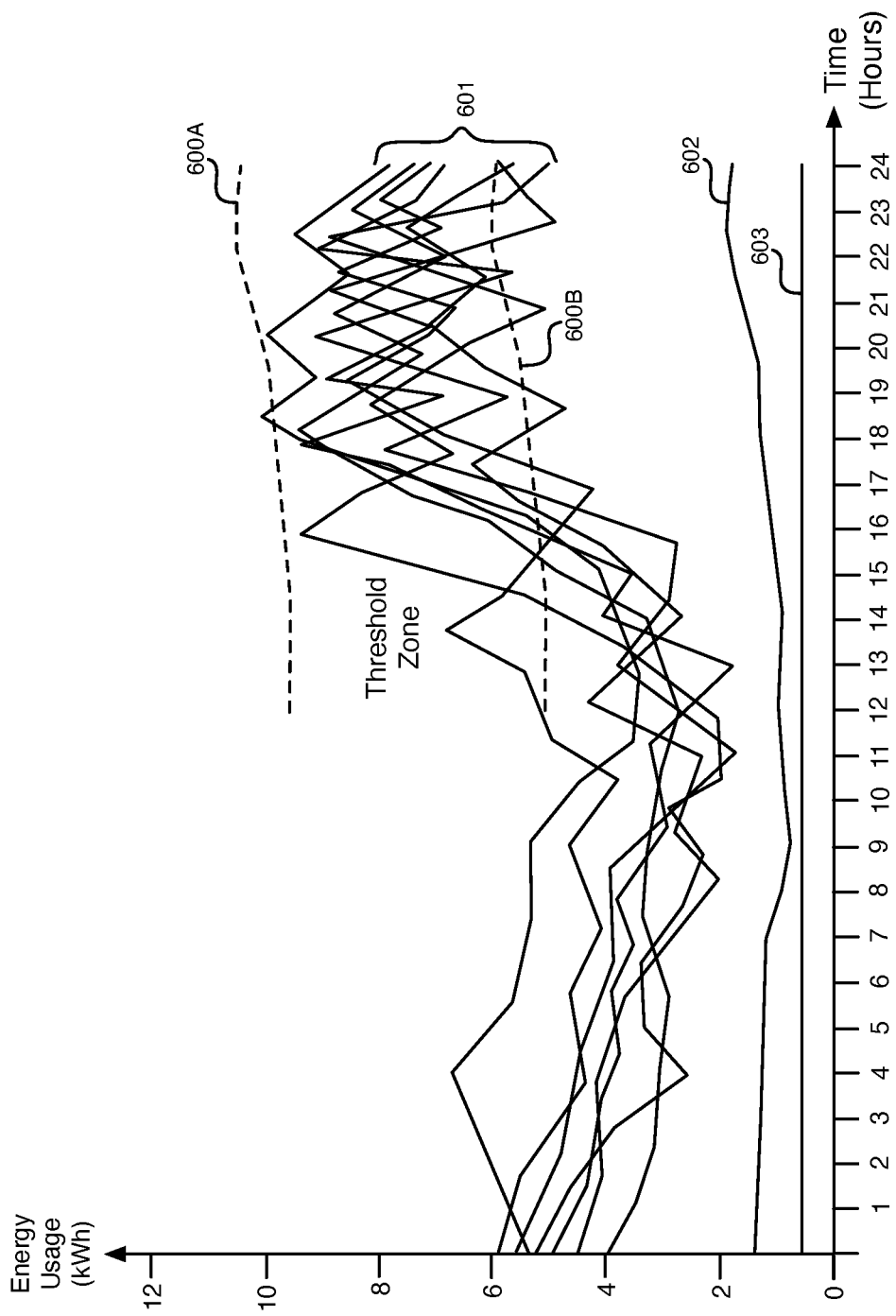
FIG. 6 is a graph that illustrates examples of two thresholds that are used to determine whether to assign a flag at each hourly interval that is analyzed in each day of power usage data evaluated from a utility customer site, according to an embodiment.

In another embodiment, two thresholds are used to determine if a flag is to be assigned at each time interval analyzed in each day of power usage data that is evaluated in operation 205. FIG. 6 is a graph that illustrates examples of two thresholds 600A-600B that are used to determine whether to assign a flag at each hourly time interval that is analyzed in each day of power usage data evaluated from a utility customer site, according to an embodiment. In the graph of FIG. 6, the temperature dependent loads for 7 different days are shown by the 7 solid lines 601. In this example, the process of FIG. 2 compares the thresholds 600A-600B to each of the temperature dependent load lines 601 for each of the 7 days at each of the 12 hourly time intervals between 12:00 PM (noon) and 12:00 AM (midnight) in operation 205 to determine whether to assign an hourly flag. The thresholds 600A-600B define a threshold zone from 12:00 PM to 12:00 AM in each day in the example of FIG. 6 that is between 4.5 kWh and 9.5 kWh greater than the variable load 602. FIG. 6 also shows the base load 603. The thresholds 600A-600B are shown as dotted lines in FIG. 6. In operation 205, an hourly flag is assigned to each hourly time interval between 12:00 PM and 12:00 AM during which the temperature dependent load 601 for any day is between the thresholds 600A and 600B. Operation 205 is repeated for each of the temperature dependent load lines 601 for each of the days evaluated. A daily flag may be assigned to each day having a number of hourly flags that exceeds a predefined maximum number (e.g., 8) of hourly flags. The number of hourly flags in a day that causes the assignment of a daily flag is dependent on which threshold methodology is used. Comparing each hourly interval during only the second half of each day (i.e., from noon to midnight) to the threshold zone allows for identifying equipment malfunctions (e.g., an HVAC equipment malfunction) occurring during the afternoon and evening hours when utility customers are more likely to use their HVAC equipment.

Temporary abnormal power usage patterns that trigger hourly or daily flags are common at many utility customer sites. To account for these temporary anomalies, the flags are tallied and must satisfy one or more criteria. The scope and timeframe of the analysis determines how many accumulated flags will trigger individual customer diagnostics. In operation 206, the number of flags generated for each utility customer site within a specified time period is evaluated according to filtering parameters to determine the utility customer sites most likely to have equipment malfunctions. As an example, criteria may be applied for the number of hourly flags generated for a utility customer site per day and/or the number of daily flags generated at the utility customer site in the evaluated time period. In operation 206, utility customer sites that are assigned less than a predefined number of flags (e.g., hourly flags and/or daily flags) are filtered out (e.g., as random usage anomalies).

In operation 206, parameters may also be applied to exclude grow houses (e.g., utility customer sites growing a large number of marijuana plants) from further analysis by the process of FIG. 2. As an example, the process of FIG. 2 may automatically filter out from further analysis any utility customer sites that have an average hourly power usage of more than 6 kWh during temperature independent days to account for potential grow houses. The metric used to filter out potential grow houses may, for example, be created during the estimation of the base load.

To prioritize deeper individual customer analysis, the cost of wasted energy caused by malfunctioning equipment at a utility customer site is calculated in operation 207 for each daily flag generated in operation 205. The process of FIG. 2 may, for example, use the lower boundary of the threshold (e.g., a single threshold as in FIG. 5 or the lower boundary 600B of two thresholds as in FIG. 6) to determine the area of normal power usage and the area of wasted power usage. Additional energy from the temperature dependent load that is greater than the threshold is labeled as wasted energy. Blended electricity price rates or time of day (TOD) electricity price rates may be applied to the temperature dependent loads that are greater than the threshold to estimate the cost of wasted energy from the malfunctioning equipment. Utility customer sites that have the highest costs of wasted energy are prioritized for manual customer diagnostics.

Figure 7:
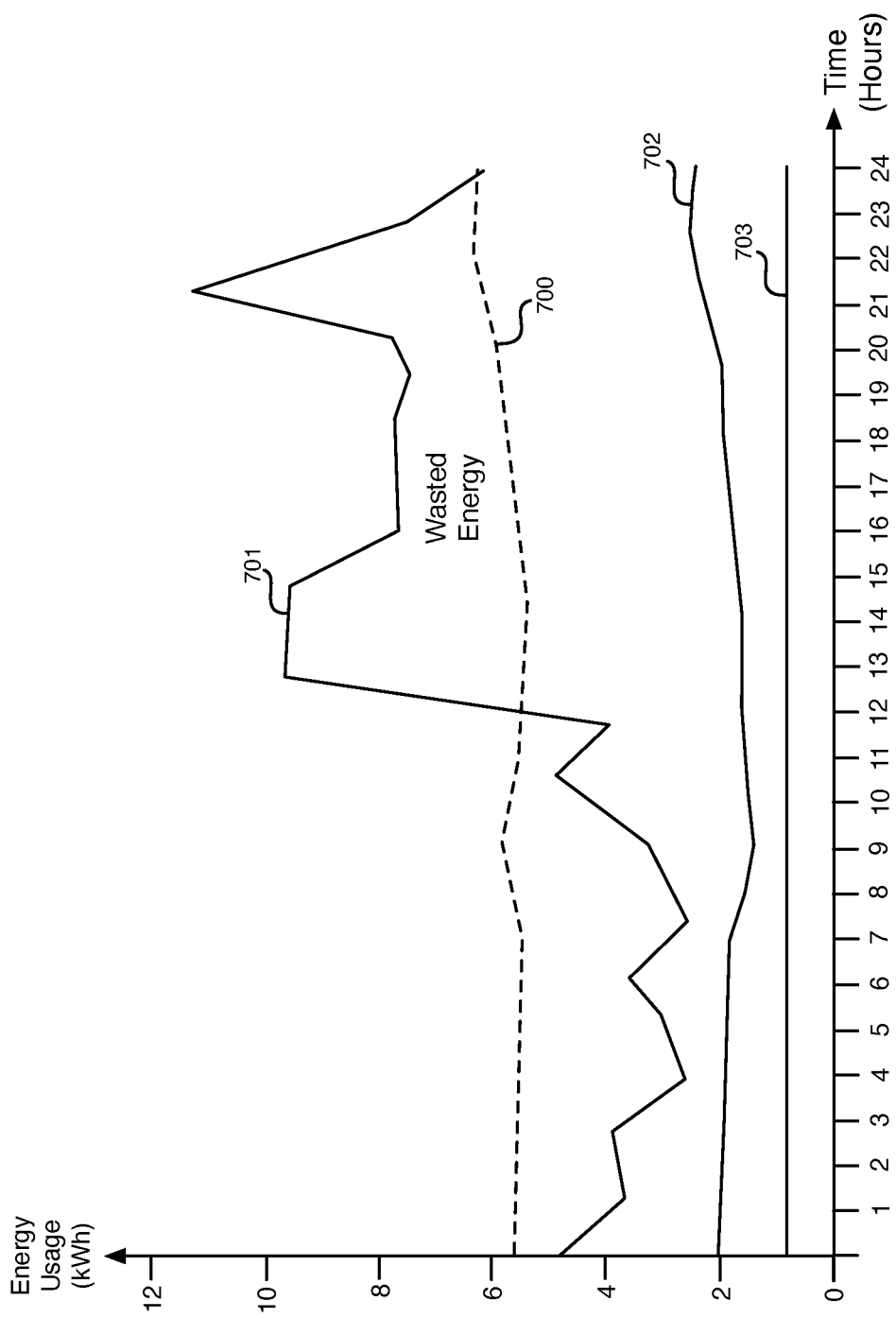
FIG. 7 is a graph that illustrates an example of the energy wasted by malfunctioning heating, ventilation, and air-conditioning (HVAC) equipment at a utility customer site in a single day, according to an embodiment.

FIG. 7 is a graph that illustrates an example of the energy wasted by malfunctioning HVAC equipment at a utility customer site in a single day, according to an embodiment. FIG. 7 illustrates examples of a threshold 700, a temperature dependent load 701, a temperature independent variable load 702, and a base load 703. In operation 207, the area between the temperature dependent load 701 and the threshold 700 is calculated in kWh (only where the temperature dependent load 701 is greater than the threshold 700) and labeled as wasted energy, as shown in FIG. 7. Then, blended kWh electricity price rates are multiplied by the amount of wasted energy calculated in kWh to determine the cost of the wasted energy in operation 207.

The daily wasted energy costs are calculated for each daily flag generated for each utility customer site and aggregated in operation 207. Utility customer sites having the highest costs of wasted energy are prioritized for individual customer diagnostics. The cost of wasted energy may be calculated using any type of electricity price rate. As an example, variable electricity price rates may be used to estimate the wasted cost of malfunctioning HVAC loads during summer peak power usage times.

After operation 207, manual customer diagnostics may be performed on each individual electric meter generating flags that pass the filtering parameters used in operation 206 to identify potential equipment malfunctions and propose solutions. One or more analysts can manually analyze the energy usage data from the electric meter at each utility customer site that was assigned flags that pass the filtering parameters to identify specific equipment issues that may be causing the flags. For example, one or more analysts may analyze HVAC start times at various outdoor temperatures, analyze HVAC temperature met times compared to the outdoor temperature at the present time, analyze HVAC full run times per hour compared to power percentage per hour, separate behavior-based issues versus equipment issues, dissect power usage for low refrigerant clues, dirty coil clues, water heater trends, base trends, house previous history trends, weight in square footage, and/or neighborhood trends with diagnostic results, and/or calculate all instances of flag occurrences to gauge total energy used and money wasted. Customized solutions may be created for each individual utility customer site likely to have equipment malfunctions. Outreach may be performed to the utility customers at these sites.

The following examples pertain to further embodiments. Example 1 is a computer system comprising at least one processor device and at least one storage device, wherein the computer system is configured to: determine a base load at a utility customer site using power usage data for the utility customer site; determine a variable load at the utility customer site during a range of temperature independent days using the power usage data; determine a temperature dependent load at the utility customer site that exceeds the variable load and the base load using the power usage data; assign a flag to each time interval that the temperature dependent load exceeds a power usage threshold; and determine if the utility customer site has an equipment malfunction based on a number of the flags assigned within a time period.

In Example 2, the computer system of Example 1 may optionally include, wherein the computer system is further configured to determine the base load using polynomial regression analysis, and wherein the base load represents a minimum amount of energy consumed at the utility customer site.

In Example 3, the computer system of Example 2 may optionally include, wherein the computer system is further configured to determine the variable load based on results of the polynomial regression analysis, and wherein the temperature independent days are selected from the power usage data as days in which power usage at the utility customer site is independent of outdoor temperatures.

In Example 4, the computer system of Example 1 may optionally include, wherein the computer system is further configured to determine the temperature dependent load based on hourly power usage indicated by the power usage data that exceeds the variable load and the base load during temperature dependent days during which the hourly power usage at the utility customer site varies based on outdoor temperatures.

In Example 5, the computer system of Example 1 may optionally include, wherein the power usage threshold is greater than the base load and the variable load.

In Example 6, the computer system of Example 5 may optionally include, wherein the power usage threshold comprises an upper threshold and a lower threshold that define a threshold zone.

In Example 7, the computer system of Example 1 may optionally include, wherein the computer system is further configured to assign an hourly flag to each hour in the power usage data that the temperature dependent load exceeds the power usage threshold, and to determine that the utility customer site has the equipment malfunction based on a number of the hourly flags generated in each day.

In Example 8, the computer system of Example 7 may optionally include, wherein the computer system is further configured to assign a daily flag to each day that is assigned at least a predefined number of the hourly flags, and to determine that the utility customer site has the equipment malfunction based on a number of the daily flags generated in the time period.

Example 9 is a method for performing energy diagnostics to identify an equipment malfunction at a utility customer site using a computer system comprising at least one processor device and at least one storage device, wherein the method comprises: determining a base load at the utility customer site using power usage data for the utility customer site; determining a variable load at the utility customer site during a range of temperature independent days using the power usage data; determining a temperature dependent load at the utility customer site that exceeds the variable load and the base load using the power usage data; assigning a flag to each time interval that the temperature dependent load exceeds a power usage threshold; and determining if the utility customer site has the equipment malfunction based on a number of the flags assigned within a time period.

In Example 10, the method of Example 9 may optionally include, wherein determining the base load further comprises determining the base load using polynomial regression analysis, and wherein determining the variable load further comprises selecting the temperature independent days from the power usage data as days in which power usage at the utility customer site is independent of outdoor temperatures, and determining the variable load based on results of the polynomial regression analysis.

In Example 11, the method of Example 9 may optionally include, wherein determining the temperature dependent load further comprises determining the temperature dependent load based on hourly power usage indicated by the power usage data that exceeds the variable load and the base load during temperature dependent days during which the hourly power usage at the utility customer site varies based on outdoor temperatures.

In Example 12, the method of Example 9 may optionally include, wherein the base load represents a minimum amount of energy consumed at the utility customer site.

In Example 13, the method of Example 9 may optionally include, wherein assigning the flag to each time interval that the temperature dependent load exceeds the power usage threshold further comprises assigning an hourly flag to each hour that the temperature dependent load exceeds the power usage threshold in the power usage data.

In Example 14, the method of Example 13 may optionally include, wherein assigning the flag to each time interval that the temperature dependent load exceeds the power usage threshold further comprises assigning a daily flag to each day that is assigned at least a predefined number of the hourly flags.

In Example 15, the method of Example 14 may optionally include, wherein determining if the utility customer site has the equipment malfunction based on the number of the flags assigned within the time period further comprises determining that the utility customer site has the equipment malfunction based on a number of the daily flags generated in the time period.

Example 16 is a non-transitory computer readable storage medium comprising instructions stored thereon for causing a processor in a computer system to execute a method for performing energy diagnostics to identify an equipment malfunction at a utility customer site, wherein the method comprises: determining a base load at the utility customer site using power usage data for the utility customer site; determining a variable load at the utility customer site during a range of temperature independent days using the power usage data; determining a temperature dependent load at the utility customer site that exceeds the variable load and the base load using the power usage data; assigning a flag to each time interval that the temperature dependent load exceeds a power usage threshold; and determining if the utility customer site has the equipment malfunction based on a number of the flags assigned within a time period.

In Example 17, the non-transitory computer readable storage medium of Example 16 may optionally include, wherein determining the temperature dependent load further comprises determining the temperature dependent load based on hourly power usage indicated by the power usage data that exceeds the variable load and the base load during temperature dependent days during which the hourly power usage at the utility customer site varies based on outdoor temperatures.

In Example 18, the non-transitory computer readable storage medium of Example 16 may optionally include, wherein assigning the flag to each time interval that the temperature dependent load exceeds the power usage threshold further comprises assigning an hourly flag to each hour that the temperature dependent load exceeds the power usage threshold.

In Example 19, the non-transitory computer readable storage medium of Example 18 may optionally include, wherein assigning the flag to each time interval that the temperature dependent load exceeds the power usage threshold further comprises assigning a daily flag to each day that is assigned at least a predefined number of the hourly flags.

In Example 20, the non-transitory computer readable storage medium of Example 19 may optionally include, wherein determining if the utility customer site has the equipment malfunction based on the number of the flags assigned within the time period further comprises determining that the utility customer site has the equipment malfunction based on a number of the daily flags generated in the time period.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A computer system comprising at least one processor device and at least one storage device, wherein the computer system is configured to:
   determine a base load at a utility customer site using polynomial regression analysis with power usage data for the utility customer site;
   select temperature independent days from the power usage data as days that are within a range of a balance temperature;
   determine a variable load at the utility customer site based on results of the polynomial regression analysis using machine learning clustering algorithms during a range of the temperature independent days using the power usage data;
   determine a temperature dependent load at the utility customer site that exceeds the variable load and the base load using the power usage data;
   assign a flag to each time interval that the temperature dependent load exceeds a power usage threshold; and
   determine if the utility customer site has an equipment malfunction based on a number of the flags assigned within a time period.

2. The computer system of claim 1, wherein the base load represents a minimum amount of energy consumed at the utility customer site.

3. The computer system of claim 1, wherein the computer system is further configured to determine the variable load for the utility customer site by assigning an electric meter the range of the temperature independent days based on the results of the polynomial regression analysis.

4. The computer system of claim 1, wherein the computer system is further configured to determine the temperature dependent load based on hourly power usage indicated by the power usage data that exceeds the variable load and the base load during temperature dependent days during which the hourly power usage at the utility customer site varies based on outdoor temperatures.

5. The computer system of claim 1, wherein the power usage threshold is greater than the base load and the variable load.

6. The computer system of claim 5, wherein the power usage threshold comprises an upper threshold and a lower threshold that define a threshold zone.

7. The computer system of claim 1, wherein the computer system is further configured to assign an hourly flag to each hour in the power usage data that the temperature dependent load exceeds the power usage threshold, and to determine that the utility customer site has the equipment malfunction based on a number of the hourly flags generated in each day.

8. The computer system of claim 7, wherein the computer system is further configured to assign a daily flag to each day that is assigned at least a predefined number of the hourly flags, and to determine that the utility customer site has the equipment malfunction based on a number of the daily flags generated in the time period.

9. A method for performing energy diagnostics to identify an equipment malfunction at a utility customer site using a computer system comprising at least one processor device and at least one storage device, wherein the method comprises:
   determining a base load at the utility customer site using power usage data for the utility customer site using polynomial regression analysis;
   selecting temperature independent days from the power usage data as days that are within a range of a balance temperature;
   determining a variable load at the utility customer site based on results of the polynomial regression analysis using machine learning clustering algorithms during a range of the temperature independent days using the power usage data;
   determining a temperature dependent load at the utility customer site that exceeds the variable load and the base load using the power usage data;
   assigning a flag to each time interval that the temperature dependent load exceeds a power usage threshold; and
   determining if the utility customer site has the equipment malfunction based on a number of the flags assigned within a time period.

10. The method of claim 9, wherein determining the variable load further comprises determining the variable load for the utility customer site by assigning an electric meter the range of the temperature independent days based on the results of the polynomial regression analysis.

11. The method of claim 9, wherein determining the temperature dependent load further comprises determining the temperature dependent load based on hourly power usage indicated by the power usage data that exceeds the variable load and the base load during temperature dependent days during which the hourly power usage at the utility customer site varies based on outdoor temperatures.

12. The method of claim 9, wherein the base load represents a minimum amount of energy consumed at the utility customer site.

13. The method of claim 9, wherein assigning the flag to each time interval that the temperature dependent load exceeds the power usage threshold further comprises assigning an hourly flag to each hour that the temperature dependent load exceeds the power usage threshold in the power usage data.

14. The method of claim 13, wherein assigning the flag to each time interval that the temperature dependent load exceeds the power usage threshold further comprises assigning a daily flag to each day that is assigned at least a predefined number of the hourly flags.

15. The method of claim 14, wherein determining if the utility customer site has the equipment malfunction based on the number of the flags assigned within the time period further comprises determining that the utility customer site has the equipment malfunction based on a number of the daily flags generated in the time period.

16. A non-transitory computer readable storage medium comprising instructions stored thereon for causing a processor in a computer system to execute a method for performing energy diagnostics to identify an equipment malfunction at a utility customer site, wherein the method comprises:
   determining a base load at the utility customer site using power usage data for the utility customer site using polynomial regression analysis;
   selecting temperature independent days from the power usage data as days that are within a range of a balance temperature;
   determining a variable load at the utility customer site based on results of the polynomial regression analysis using machine learning clustering algorithms during a range of the temperature independent days using the power usage data;
   determining a temperature dependent load at the utility customer site that exceeds the variable load and the base load using the power usage data;
   assigning a flag to each time interval that the temperature dependent load exceeds a power usage threshold; and
   determining if the utility customer site has the equipment malfunction based on a number of the flags assigned within a time period.

17. The non-transitory computer readable storage medium of claim 16, wherein determining the temperature dependent load further comprises determining the temperature dependent load based on hourly power usage indicated by the power usage data that exceeds the variable load and the base load during temperature dependent days during which the hourly power usage at the utility customer site varies based on outdoor temperatures.

18. The non-transitory computer readable storage medium of claim 16, wherein assigning the flag to each time interval that the temperature dependent load exceeds the power usage threshold further comprises assigning an hourly flag to each hour that the temperature dependent load exceeds the power usage threshold.

19. The non-transitory computer readable storage medium of claim 18, wherein assigning the flag to each time interval that the temperature dependent load exceeds the power usage threshold further comprises assigning a daily flag to each day that is assigned at least a predefined number of the hourly flags.

20. The non-transitory computer readable storage medium of claim 19, wherein determining if the utility customer site has the equipment malfunction based on the number of the flags assigned within the time period further comprises determining that the utility customer site has the equipment malfunction based on a number of the daily flags generated in the time period.

* * * * *